(12) United States Patent
Serikawa et al.

(10) Patent No.: US 9,796,881 B2
(45) Date of Patent: Oct. 24, 2017

(54) POLISHING COMPOSITION AND METHOD USING SAID POLISHING COMPOSITION TO MANUFACTURE COMPOUND SEMICONDUCTOR SUBSTRATE

(71) Applicant: FUJIMI INCORPORATED, Kiyosu-shi, Aichi (JP)

(72) Inventors: Masayuki Serikawa, Kiyosu (JP); Tomomi Akiyama, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/381,373

(22) PCT Filed: Mar. 4, 2013

(86) PCT No.: PCT/JP2013/055801
§ 371 (c)(1),
(2) Date: Aug. 27, 2014

(87) PCT Pub. No.: WO2013/133198
PCT Pub. Date: Sep. 12, 2013

(65) Prior Publication Data
US 2015/0050862 A1    Feb. 19, 2015

(30) Foreign Application Priority Data
Mar. 5, 2012    (JP) .................................. 2012-048269

(51) Int. Cl.
| | | |
|---|---|---|
| *C09G 1/02* | (2006.01) | |
| *H01L 21/302* | (2006.01) | |
| *H01L 21/02* | (2006.01) | |
| *B24B 37/04* | (2012.01) | |
| *H01L 21/306* | (2006.01) | |
| *H01L 29/16* | (2006.01) | |
| *H01L 29/20* | (2006.01) | |

(52) U.S. Cl.
CPC .............. *C09G 1/02* (2013.01); *B24B 37/044* (2013.01); *H01L 21/02024* (2013.01); *H01L 21/302* (2013.01); *H01L 21/30625* (2013.01); *H01L 29/1608* (2013.01); *H01L 29/2003* (2013.01)

(58) Field of Classification Search
CPC ... C09G 1/02; B24B 37/044; H01L 21/02024; H01L 21/302; H01L 21/30625; H01L 29/1608; H01L 29/2003
USPC ............................................................ 451/41
See application file for complete search history.

(56) References Cited

U.S. PATENT DOCUMENTS

| | | | |
|---|---|---|---|
| 2006/0030243 A1* | 2/2006 | Nishimoto ........... | B24B 37/0056 451/41 |
| 2008/0057713 A1* | 3/2008 | Desai ....................... | C09G 1/02 438/691 |
| 2008/0171441 A1* | 7/2008 | Takemiya ................ | C09G 1/02 438/693 |
| 2008/0206995 A1* | 8/2008 | Tomiga .................... | C09G 1/02 438/693 |
| 2010/0092366 A1* | 4/2010 | Kogoi ................. | B24B 37/0056 423/345 |
| 2011/0223840 A1* | 9/2011 | Morinaga ................ | C09G 1/02 451/28 |
| 2013/0092871 A1* | 4/2013 | Sekiguchi ............. | B24B 37/042 252/79.1 |
| 2013/0324015 A1* | 12/2013 | Asano ................... | B24B 37/044 451/59 |
| 2016/0325398 A1* | 11/2016 | Fujimoto .............. | B24B 37/044 |

FOREIGN PATENT DOCUMENTS

| | | | | |
|---|---|---|---|---|
| JP | 2007-027663 A | | 2/2007 | |
| JP | 2007-165566 A | | 6/2007 | |
| JP | 2007-208215 A | | 8/2007 | |
| JP | 2008060460 A | * | 3/2008 | |
| JP | 2010-284784 A | | 12/2010 | |
| TW | 201202402 A | | 1/2012 | |
| WO | WO 2011162265 A1 | * | 12/2011 | ........... B24B 37/042 |

* cited by examiner

*Primary Examiner* — Eileen Morgan
(74) *Attorney, Agent, or Firm* — Foley & Lardner LLP

(57) ABSTRACT

A polishing composition contains abrasive grains and water. 50% by mass or more of the abrasive grains consists of particles A having particle sizes between 40 nm and 80 nm inclusive, and 10% by mass or more of the abrasive grains consists of particles B having particle sizes between 150 nm and 300 nm inclusive. The polishing composition is used to polish a surface of a compound semiconductor substrate.

11 Claims, No Drawings

POLISHING COMPOSITION AND METHOD USING SAID POLISHING COMPOSITION TO MANUFACTURE COMPOUND SEMICONDUCTOR SUBSTRATE

TECHNICAL FIELD

The present invention relates to a polishing composition used in applications in which an object to be polished consisting of a compound semiconductor is polished and to a method for manufacturing a compound semiconductor substrate using the polishing composition.

BACKGROUND ART

A compound semiconductor is a semiconductor composed of a plurality of elements. For example, compound semiconductors containing silicon carbide, gallium nitride, gallium arsenide, or the like have been known. Compound semiconductor substrates containing silicon carbide or gallium nitride are used as materials for manufacturing LEDs or power devices. When the compound semiconductor substrates are used for various materials, it is required to polish the substrate surface into a super-smooth surface. Various polishing compositions have been used for polishing the surface of such compound semiconductor substrates (for example, see Patent Documents 1 and 2).

Silicon carbide and gallium nitride have an excellent corrosion resistance to, i.e., high chemical stability in, acids and alkalis and have the second highest hardness after diamond. Therefore, polishing of compound semiconductor substrates containing silicon carbide or gallium nitride requires a large amount of time. Accordingly, what is important for the polishing compositions used for polishing the above-described compound semiconductor substrates is realization of a high polishing rate.

In Patent Document 1, an oxidizing agent such as ortho-periodic acid or metaperiodic acid, and colloidal silica abrasive grains are contained in a polishing composition for polishing a silicon carbide substrate, whereby the polishing rate is intended to be increased. In Patent Document 2, an oxidizing agent such as tungstates or molybdates, an oxygen donor, abrasive grains, and a pH adjuster are contained in a polishing composition, whereby the polishing rate is intended to be increased. Specifically, when the oxidizing agent is a transition metal salt, the valence of the oxidizing agent changes in the oxidation reaction since the transition metal element can have a plurality of oxidation numbers. In addition, the oxygen donor restores the changed valence of the oxidizing agent, whereby the high oxidative power of the oxidizing agent can be maintained. In the polishing composition, use of the oxygen donor and the transition metal oxidizing agent in a proper combination leads to an increased polishing rate.

PRIOR ART DOCUMENTS

Patent Documents

Patent Document 1: Japanese Laid-Open Patent Publication No. 2007-027663
Patent Document 2: Japanese Laid-Open Patent Publication No. 2010-284784

SUMMARY OF THE INVENTION

Problems that the Invention is to Solve

The present inventors have diligently researched to find that the polishing rate for a compound semiconductor substrate can be increased by using a polishing composition containing abrasive grains and water in which 50% by mass or more of the abrasive grains consists of particles A having particle sizes between 40 nm and 80 nm inclusive, and 10% by mass or more of the abrasive grains consists of particles B having particle sizes between 150 nm and 300 nm inclusive. An objective of the present invention is to provide a polishing composition capable of polishing a compound semiconductor substrate, particularly a compound semiconductor substrate having a high hardness (e.g., Vickers hardness of 1,500 Hv or more) at a high polishing rate. A further objective of the present invention is to provide a method for manufacturing a compound semiconductor substrate using such a polishing composition.

Means for Solving the Problems

In accordance with one aspect of the present invention, a polishing composition for use in polishing a compound semiconductor substrate is provided. The polishing composition contains abrasive grains and water. 50% by mass or more of the abrasive grains consists of particles A having particle sizes between 40 nm and 80 nm inclusive. 10% by mass or more of the abrasive grains consists of particles B having particle sizes between 150 nm and 300 nm inclusive.

The type of the abrasive grains is preferably at least one selected from silicon oxide, aluminum oxide, zirconium oxide, titanium oxide, manganese oxide, iron oxide, chromium oxide, and diamond.

The polishing composition preferably further contains an oxidizing agent. The polishing composition also preferably contains a pH adjuster.

In accordance with another aspect of the present invention, a method for manufacturing a compound semiconductor substrate is provided. The method includes a polishing step of polishing a compound semiconductor substrate using the above described polishing composition.

Effects of the Invention

According to the present invention, a compound semiconductor substrate, particularly a compound semiconductor substrate having a high hardness of Vickers hardness of 1,500 Hv or more, can be polished at a high polishing rate.

MODES FOR CARRYING OUT THE INVENTION

An embodiment of the present invention will now be described.

The polishing composition is used in applications in which a compound semiconductor substrate is polished in a compound semiconductor substrate manufacturing process and the like. The compound semiconductor substrate to be polished is a substrate consisting of a semiconductor composed of a plurality of elements. Examples of materials composing the compound semiconductor include silicon carbide, gallium nitride, and gallium arsenide. The polishing composition of the present embodiment can be suitably used particularly in applications in which a compound semiconductor substrate having a high hardness (e.g., Vickers hardness of 1,500 Hv or more), of which specific examples include a compound semiconductor substrate consisting of silicon carbide or gallium nitride, is polished.

The polishing composition contains abrasive grains and water, and preferably further contains ingredients such as an oxidizing agent and a pH adjuster. The polishing composition is prepared by mixing each of the ingredients such as the abrasive grains in water.

Abrasive Grains

The abrasive grains function to physically polish the surface of a compound semiconductor substrate. Examples of the abrasive grains include particles consisting of silicon oxide, aluminum oxide, zirconium oxide, cerium oxide, titanium oxide, manganese oxide, iron oxide, chromium oxide, and diamond. Among these particles, particles consisting of silicon oxide and aluminum oxide are preferred from the viewpoint of increasing the polishing rate, and particles consisting of silicon oxide are particularly preferred. Examples of the particles consisting of silicon oxide include silica particles selected from colloidal silica, fumed silica, and sol-gel silica. Among these particles, colloidal silica is particularly preferred. These abrasive grains may be used singly or in combinations of two or more.

The abrasive grains preferably have a particle shape that is close to the perfect sphere. Specifically, the average value of major axis/minor axis ratios of the particles is preferably 1.2 or less, and more preferably 1.1 or less.

The major axis/minor axis ratios can be obtained, for example, by using electron microscope images of the abrasive grains. Specifically, the minimum bounding rectangle is drawn for each particle on the scanning electron microscope images of a predetermined number of (e.g., 200) particles. Subsequently, for each minimum bounding rectangle the length of the long side (major axis value) is divided by the length of the short side (minor axis value). Then, the average value of the major axis/minor axis ratios can be obtained by calculating the average value of the obtained ratios. The calculation of the average value of the major axis/minor axis ratios based on such image analysis processing can be performed using general image analysis software.

In the polishing composition, the abrasive grains have a specific particle size distribution. Specifically, the ratio of particles A having particle sizes between 40 nm and 80 nm inclusive (small particles) to all the abrasive grains contained in the polishing composition is 50% or more on a mass basis, and the ratio of particles B having particle sizes between 150 nm and 300 nm inclusive (large particles) is 10% or more. In addition, the ratio of all of the particles A and the particles B to all the abrasive grains contained in the polishing composition is 60% or more on a mass basis, and preferably 80% or more. By using the abrasive grains having the particle size distribution described above, a high polishing rate can be attained when polishing a compound semiconductor substrate.

The particle sizes described above are agglomerate sizes (secondary particle sizes). The particle size distribution can be measured by, for example, a dynamic light scattering method using UPA-EX250 manufactured by Nikkiso Co., Ltd. When two or more kinds of particles (for example, particles of silicon oxide and particles of aluminum oxide) are mixed, the particle size distribution may be obtained in the state where the particles of different types are mixed with each other, or the particle size distribution may be measured by separately measuring the particle sizes for each kind of particles and synthesizing those particle sizes according to the mixing ratio of the particles.

The total content of the abrasive grains in the polishing composition is preferably 2% by mass or more, and more preferably 10% by mass or more. The higher the total content of the abrasive grains, the higher the polishing rate that can be attained. The total content of the abrasive grains in the polishing composition is preferably 50% by mass or less, and more preferably 40% by mass or less. The lower the total content of the abrasive grains, the more improved the dispersion stability of the polishing composition and the more easily the polishing composition can be handled.

Water

Water is a dispersion medium or a solvent for the other ingredients. The water preferably does not inhibit the functions of the other ingredients contained in the polishing composition. Examples of such water include water having a total content of transition metal ions of 100 ppb or less. The purity of the water can be improved by, for example, removal of impurity ions using an ion exchange resin, removal of foreign matters using a filter, or distillation. Specifically, it is preferred to use, for example, deionized water, pure water, super-pure water, or distilled water.

Oxidizing Agent

The polishing composition may contain an oxidizing agent. The oxidizing agent functions to chemically polish the surface of a compound semiconductor substrate. Examples of the oxidizing agent include permanganates, periodic acid, periodates, persulfates, vanadates, hydrogen peroxide water, hypochlorites, iron oxide, peracetic acid, and ozone. Among these oxidizing agents, permanganates or vanadates are preferred from the viewpoint of increasing the polishing rate. These oxidizing agents may be used singly or in combinations of two or more. In addition, the oxidizing agent may be used, for example, as a mixture with an oxygen donor such as peroxides or oxo acids.

The content of the oxidizing agent in the polishing composition is preferably 0.2% by mass or more, and more preferably 0.5% by mass or more. The higher the oxidizing agent content, the higher the polishing rate that can be attained. The content of the oxidizing agent in the polishing composition is preferably 10% by mass or less, and more preferably 5% by mass or less. The lower the oxidizing agent content, the more stable the polishing composition becomes.

pH

The pH range of the polishing composition is preferably 1.0 or more and less than 11.0, and more preferably 2.0 or more and less than 8.0. When the pH of the polishing composition is within the range described above, the polishing rate is increased.

The pH of the polishing composition can be adjusted, for example, by adding a pH adjuster. As the pH adjusters, known acids, bases, or salts thereof can be used.

Examples of acids usable as the pH adjusters include inorganic acids such as hydrochloric acid, sulfuric acid, nitric acid, hydrofluoric acid, boric acid, carbonic acid, hypophosphorous acid, phosphorous acid, and phosphoric acid; and organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furan carboxylic acid, 2,5-furan dicarboxylic acid, 3-furan carboxylic acid, 2-tetrahydrofuran carboxylic acid, methoxy acetic acid, methoxy phenyl acetic acid, and phenoxy acetic acid. Among the above-described inorganic acids, phosphoric acid, nitric acid, or sulfuric acid is particularly preferably used, and among the above-described organic acids, citric acid, oxalic acid, or tartaric acid is preferably used from the viewpoint of increasing the polishing rate.

Examples of bases usable as pH adjusters include organic bases such as quaternary ammonium hydroxides and amines, alkali metal hydroxides, alkaline earth metal hydroxides, and ammonia.

Salts such as ammonium salts or alkali metal salts of the above-described acids may also be used in place of or in combination with the above-described acids. In particular, salts of combinations of weak acids and strong bases, strong acids and weak bases, or weak acids and weak bases are preferred. Such salts are expected to exert a buffering effect on pH.

Other Ingredients

Other ingredients such as known additives commonly contained in polishing compositions may be contained in the polishing composition as necessary. Examples of other ingredients include a preservative, an antifungal agent, and a rust-preventive agent, as well as additives having a function to further increase the polishing rate such as a complexing agent and an etching agent, a dispersing agent to improve dispersion of the abrasive grains, and a dispersion auxiliary for easing redispersion of the aggregates.

Then, a polishing step of polishing a compound semiconductor substrate using the above-described polishing composition will be described. Described herein is a polishing step of polishing a silicon carbide substrate, which is a compound semiconductor substrate having a high hardness, as an example.

Polishing of a silicon carbide substrate using the above-described polishing composition can be performed using a common polishing apparatus. Examples of the polishing apparatuses include a single-side polishing apparatus and a double-side polishing apparatus. In the single-side polishing apparatus, the substrate is held using a holding tool called a carrier, a platen onto which a polishing fabric has been attached (polishing pad) is pressed against the single surface of the substrate, and the platen is rotated to polish the single surface of the substrate, while the polishing composition is being supplied. In the double-side polishing apparatus, the substrate is held using the carrier, platens onto which polishing fabrics have been attached (polishing pads) are each pressed against both surfaces of the substrate, and the platens are rotated in opposite directions to each other to polish both surfaces of the substrate, while the polishing composition is being supplied from the upper side. Then, the substrate is polished by a physical action due to the friction between the polishing pad together with the polishing composition and the substrate and by a chemical action given to the substrate by the polishing composition.

The polishing conditions in the polishing step are not particularly limited, but it is preferred to set a polishing pressure and a linear velocity against the substrate in respective specific ranges from the viewpoint of increasing the polishing rate.

Specifically, the polishing pressure preferably exceeds 400 g per $cm^2$ of machining area, and is more preferably 600 g or more per $cm^2$ of machining area. In addition, the polishing pressure is preferably 1000 g or less per $cm^2$ of machining area. The higher the polishing pressure, the greater the number of contact points between the abrasive grains in the polishing composition and the substrate becomes, which increases the friction force. Therefore, the polishing rate tends to be increased under higher pressures. Although a polishing pressure of 400 g or less per $cm^2$ of machining area is usually applied in the polishing of the silicon carbide substrate, a higher pressure than such a common polishing pressure is preferably applied in the present embodiment.

The linear velocity is a value that generally varies by the influence of the number of revolutions of the polishing pad, the number of revolutions of the carrier, the size of the substrate, the number of the substrates, and the like. When the linear velocity is great, the friction force applied to the substrate is increased, thereby increasing the mechanical polishing action on the substrate. In addition, the heat generated by friction may improve the chemical polishing action with the polishing composition.

In the present embodiment, the linear velocity is preferably 10 m/min or more, and more preferably 30 m/min or more. Also the linear velocity is preferably 300 m/min or less, and more preferably 200 m/min or less. The greater the linear velocity, the higher the polishing rate that can be attained. When the linear velocity is within the range described above, a sufficiently high polishing rate can be attained, and additionally, a proper friction force can be applied to the substrate.

The supply rate of the polishing composition during the polishing depends on the type of the substrate to be polished, the type of the polishing apparatus, and other polishing conditions, but is preferably a rate enough to evenly supply the polishing composition over the entire surfaces of the substrate and the polishing pad.

Then, the functions of the above-described polishing composition during the polishing of the silicon carbide substrate will be described.

In the polishing composition, the abrasive grains are contained to have a specific particle size distribution in which the ratio of particles A having particle sizes between 40 nm and 80 nm inclusive (small particles) is 50% by mass or more to all the abrasive grains, and the ratio of particles B having particle sizes between 150 nm and 300 nm inclusive (large particles) is 10% by mass or more. According to the polishing composition, the silicon carbide substrate can be polished at a high polishing rate particularly at a high polishing pressure. This is an effect that cannot be obtained by the conventional polishing compositions used for polishing the silicon carbide substrate and the like. In this respect, the polishing composition described above is distinct from the prior art.

Although the detailed mechanism by which the effect described above is obtained is not clear, the effect is thought to be based on increase in the interaction energy generated between the abrasive grains and the object to be polished. Generally speaking, the friction force generated between the abrasive grains and the object to be polished results in the mechanical processing of the object to be polished using the abrasive grains. The magnitude of the friction force depends on the magnitude of the interaction energy generated between the abrasive grains and the object to be polished. The larger the abrasive grain size, the greater the number of the molecules in the abrasive grains that contact the object to be polished, which increases the interaction energy per abrasive grain. It is difficult, however, to ensure the dispersion stability of the abrasive grains in the polishing composition when a large number of the abrasive grains having large particle sizes are contained in the polishing composition. It is because that the abrasive grains are likely to be aggregated to lead to the gelation of the polishing composition when a large number of the abrasive grains having sufficiently large particle sizes to obtain the suitable interaction energy are contained in the polishing composition. Therefore, the method for increasing the polishing rate by enlarging the abrasive grain size is limited.

In contrast, in the case of the above-described polishing composition, the particles A, which are small particles, enter the gaps between the particles B, which are large particles, and the object to be polished, whereby the number of the abrasive grains contacting the object to be polished is increased and also the contact points between the abrasive grains and the object to be polished are increased. With the increasing contact points between the abrasive grains and the object to be polished, the friction force between the abrasive grains and the object to be polished is increased, thereby increasing the polishing rate.

In addition, when the polishing pressure is increased, the polishing pad is deformed under the stress so as to decrease the gaps between the polishing pad and the object to be polished. Then, the particles A (small particles), which have been trapped in the gaps between the polishing pad and the object to be polished before the deformation under the stress, are transferred into the gaps between the particles B (large particles) and the object to be polished, and this further increases the number of particles of the abrasive grains that contact the object to be polished. The increase in the number of the abrasive grains contacting the object to be polished can generate further higher friction force. That is, the pressure energy can be transformed into a higher polishing rate.

The embodiment described above achieves the following advantages.

(1) A compound semiconductor substrate such as a silicon carbide substrate can be polished at a high polishing rate.

(2) The abrasive grains are preferably at least one selected from silicon oxide, aluminum oxide, zirconium oxide, titanium oxide, manganese oxide, iron oxide, chromium oxide, and diamond. In this case, the polishing rate is more increased.

(3) The polishing compound preferably contains an oxidizing agent. In this case, a higher polishing rate can be attained.

(4) The polishing compound preferably contains a pH adjuster and the pH of the polishing compound is 1.0 or more and less than 11.0. In this case, a higher polishing rate can be attained.

(5) Since a compound semiconductor substrate can be polished at a high polishing rate, the manufacturing time of the compound semiconductor substrate can be shortened. This increases the productivity of the compound semiconductor substrate and reduces the manufacturing costs.

The above described embodiment may be modified as follows.

The polishing composition may be one-component type or multi-component type including two-component type. When, for example, the polishing composition contains an oxidizing agent and an ingredient that may induce deterioration of the oxidizing agent, the polishing composition is preferably prepared as that of multi-component type so that the ingredient and the oxidizing agent are separately contained in different components. By means of this, the preservation stability during storage or transportation can be ensured easily. In addition, when the polishing composition is of multi-component type, using a polishing apparatus having a plurality of supply passages for the polishing composition, each component composing the polishing composition may be supplied through the separate supply passages so that the components are mixed with each other within the apparatus.

The polishing composition may be manufactured or sold in the form of an undiluted solution and may be diluted when used. That is, the polishing composition may be prepared by diluting the undiluted solution of the polishing composition with water. When the polishing composition is an undiluted solution of multi-component type, order of mixing and dilution of each component is arbitrary and, for example, a specific component may be diluted with water and then mixed with the other components, or the components may be mixed with each other and then the mixture may be diluted with water.

The polishing pad used in the polishing step using the polishing composition is not particularly limited by physical properties and the like thereof such as materials, hardness, or thickness. Any of polishing pads, for example, those of polyurethane type, nonwoven fabric type, suede type, and those containing abrasive grains or not containing abrasive grains may be used.

Examples

Providing Examples and Comparative Examples, the embodiment described above will be more specifically described.

A variety of colloidal silica containing silica particles having major axis/minor axis ratios of 1.1 or less with various particle size distributions were used as abrasive grains. The above-described colloidal silica, sodium vanadate and hydrogen peroxide water as an oxidizing agent, and deionized water were mixed, and then ammonia as a pH adjuster was added to the mixture so as to adjust the pH to 6.5. In this way, the polishing compositions of Examples 1 and 2 and Comparative Examples 1 to 8 having different particle size distributions of the abrasive grains were prepared. The common composition of each polishing composition is shown in Table 1. In addition, the particle size distribution of the abrasive grains in each polishing composition is shown in Tables 3 and 4. The particle size distributions of the abrasive grains were measured by a dynamic light scattering method using UPA-EX250 manufactured by Nikkiso Co., Ltd.

Test 1

A surface of a silicon carbide substrate was polished using each of the polishing compositions of Examples 1 and 2 and Comparative Examples 1 to 8 under the conditions shown in Table 2. The silicon carbide substrate used was that having a Si surface off-angle of 0°, a circular shape having a size of 50 mm (2 inches), and a Vickers hardness of 2,200 Hv. Then, the polishing rate was evaluated for each polishing composition. The polishing rate was calculated by measuring the mass difference of the silicon carbide substrate between before and after the polishing and dividing the obtained mass difference by the density, the area, and the polishing time of the silicon carbide substrate. The results are shown in the column "Polishing rate" in Table 3. Also, each polishing composition was rated based on the calculated polishing rate. The results are shown in the column "Rating" in Table 3. The criteria for the rating are as follows:

A: the case where the polishing rate was 300 nm/h or more;

B: the case where the polishing rate was 200 nm/h or more and less than 300 nm/h; and C: the case where the polishing rate was less than 200 nm/h.

Test 2

A surface of a sapphire substrate, which was a semiconductor substrate other than the compound semiconductor substrate, was polished using each of the polishing compositions of Example 1 and Comparative Example 4 under the conditions shown in Table 2. The sapphire substrate used was a circular C-plane substrate having a size of 50 mm (2 inches). Then, the polishing rate was calculated for each polishing composition in the same way as in Test 1 described above. The results are shown in the column "Polishing rate" in Table 4.

TABLE 1

| Common composition | Content [% by mass] |
|---|---|
| Colloidal silica (total amount) | 20 |
| Sodium vanadate | 2.5 |
| Hydrogen peroxide water | 1.0 |

TABLE 2

| | |
|---|---|
| Polishing machine | Lens polishing machine (platen diameter of 380 mm) |
| Polishing pad | Non-woven fabric polishing pad "SUBA600" manufactured by Nitta Haas Incorporated |
| Number of revolutions of platen | 130 rpm |
| Linear velocity | 76 m/min |
| Polishing pressure | 400 or 700 g/cm$^2$ |
| Supply rate of polishing composition | 20 mL/min (pouring onto the substrate) |

As shown in Table 3, when the silicon carbide substrates were polished using the polishing compositions of Examples 1 and 2 containing the abrasive grains having the specific particle size distributions, the excellent polishing rates were attained comparing with the cases where the silicon carbide substrates were polished using the polishing compositions of Comparative Examples 1 to 8. On the other hand, when the sapphire substrate was used as the object to be polished, the higher polishing rate was not able to be attained in spite of the use of the polishing composition of Example 1 comparing with the polishing composition of Comparative Example 4 as shown in Table 4. From this result, it is suggested that the higher polishing rate attained using the polishing composition of the present invention is the effect that is particularly exerted when the compound semiconductor substrate, and above all, the silicon carbide substrate is used as the object to be polished. It is speculated that when the compound semiconductor substrate is used as the object to be polished, a local pressure applied to the silicon carbide substrate with the particles B, which are large particles, under the high polishing pressure promotes formation of the lattice distortion in the silicon carbide substrate to further the polishing, thereby leading to this effect.

TABLE 3

| | Abrasive grain particle size distribution [% by mass] | | | | | | |
|---|---|---|---|---|---|---|---|
| | Particles smaller than 40 nm | Particles of 40 nm or larger and 80 nm or smaller (Particles A) | Particles larger than 80 nm and smaller than 150 nm | Particles of 150 nm or larger and 300 nm or smaller (Particles B) | Particles larger than 300 nm | Polishing pressure [g/cm$^2$] | Polishing rate [nm/h] | Rating |
|---|---|---|---|---|---|---|---|---|
| Example 1 | 0.3 | 66.9 | 13.0 | 19.8 | 0 | 700 | 320 | A |
| Example 2 | 11.0 | 51.0 | 25.0 | 13.0 | 0 | 700 | 300 | A |
| Comparative Example 1 | 0 | 0 | 0.8 | 99.0 | 0.2 | 400 | 138 | C |
| Comparative Example 2 | 0 | 0 | 0.8 | 99.0 | 0.2 | 700 | 129 | C |
| Comparative Example 3 | 0.3 | 83.6 | 16.1 | 0 | 0 | 400 | 86 | C |
| Comparative Example 4 | 0.3 | 83.6 | 16.1 | 0 | 0 | 700 | 86 | C |
| Comparative Example 5 | 0.1 | 35.8 | 62.4 | 1.7 | 0 | 700 | 255 | B |
| Comparative Example 6 | 0.3 | 67.7 | 31.4 | 0.6 | 0 | 700 | 250 | B |
| Comparative Example 7 | 0.3 | 67.0 | 12.7 | 1.2 | 18.8 | 700 | 253 | B |
| Comparative Example 8 | 63.0 | 3.7 | 18.3 | 15.0 | 0 | 700 | 240 | B |

TABLE 4

| | Abrasive grain particle size distribution [% by mass] | | | | | | |
|---|---|---|---|---|---|---|---|
| | Particles smaller than 40 nm | Particles of 40 nm or larger and 80 nm or smaller (Particles A) | Particles larger than 80 nm and smaller than 150 nm | Particles of 150 nm or larger and 300 nm or smaller (Particles B) | Particles larger than 300 nm | Polishing pressure [g/cm$^2$] | Polishing rate [nm/h] |
|---|---|---|---|---|---|---|---|
| Example 1 | 0.3 | 66.9 | 13.0 | 19.8 | 0 | 700 | 790 |
| Comparative Example 4 | 0.3 | 83.6 | 16.1 | 0 | 0 | 700 | 805 |

The invention claimed is:

1. A method for polishing a substrate consisting of silicon carbide or gallium nitride, the method comprising:
   providing a substrate consisting of silicon carbide or gallium nitride; and
   polishing the substrate using a polishing composition comprising abrasive grains, water, and an oxidizing agent comprising 0.2% by mass or more of sodium vanadate, wherein
   50% by mass or more of the abrasive grains consists of particles A having particle sizes between 40 nm and 80 nm inclusive, and
   10% by mass or more of the abrasive grains consists of particles B having particle sizes between 150 nm and 300 nm inclusive.

2. The method according to claim 1, wherein the abrasive grains are at least one selected from the group consisting of silicon oxide, aluminum oxide, zirconium oxide, titanium oxide, manganese oxide, iron oxide, chromium oxide, and diamond.

3. The method according to claim 1, wherein the polishing composition further comprises an oxidizing agent.

4. The method according to claim 1, wherein the polishing composition further comprises a pH adjuster.

5. The method according to claim 3, wherein the oxidizing agent consists of a peroxide and sodium vanadate.

6. The method according to claim 5, wherein the peroxide is hydrogen peroxide.

7. The method according to claim 1, wherein the abrasive grains have an average value of major axis/minor axis ratios of 1.2 or less.

8. The method according to claim 1, wherein the polishing composition comprises a total content of the abrasive grains of 10% by mass or more.

9. The method according to claim 1, wherein all of the abrasive grains have particle sizes of not more than 300 nm.

10. The method according to claim 1, wherein the substrate consists of gallium nitride.

11. A polishing composition for use in polishing a silicon carbide substrate or a gallium nitride substrate, the polishing composition comprising abrasive grains, water, and an oxidizing agent comprising 0.2% by mass or more of sodium vanadate, wherein
    the polishing composition comprises a total content of the abrasive grains of 10% by mass or more,
    the abrasive grains have an average value of major axis/minor axis ratios of 1.2 or less,
    50% by mass or more of the abrasive grains consists of particles A having particle sizes between 40 nm and 80 nm inclusive,
    10% by mass or more of the abrasive grains consists of particles B having particle sizes between 150 nm and 300 nm inclusive,
    all of the abrasive grains have particle sizes of not more than 300 nm, and
    the oxidizing agent consists of hydrogen peroxide and the sodium vanadate.

\* \* \* \* \*